__United States Patent__ [19]

Kuklewicz

[11] Patent Number: 4,647,904

[45] Date of Patent: Mar. 3, 1987

[54] FOLDING-TYPE ANALOG-TO-DIGITAL CONVERTER

[75] Inventor: John C. Kuklewicz, Sunnyvale, Calif.

[73] Assignee: Advanced Micro Devices, Inc., Sunnyvale, Calif.

[21] Appl. No.: 605,100

[22] Filed: Apr. 30, 1984

[51] Int. Cl.[4] ............................................. H03K 13/09
[52] U.S. Cl. ............................................. 340/347 AD
[58] Field of Search ................... 340/347 AD, 347 M; 235/310

[56] References Cited

U.S. PATENT DOCUMENTS

| | | | |
|---|---|---|---|
| 4,058,806 | 11/1977 | Nadler | 340/347 AD |
| 4,275,386 | 6/1981 | Michel et al. | 340/347 AD |
| 4,306,224 | 12/1981 | Geller et al. | 340/347 AD |
| 4,325,054 | 4/1982 | Van De Plassche | 340/347 AD |
| 4,379,285 | 4/1983 | Dooley | 340/347 AD |

OTHER PUBLICATIONS

A. Arbel and R. Kurz, "Fast ADC", IEEE Transaction on Nuclear Science, vol. NS-22, Feb., 1975, pp. 446–451.

D. Hoeschele, Analog-to-Digital/Digital-to-Analog Conversion Techniques, Aug. 1968, pp. 10–11.

Primary Examiner—William M. Shoop, Jr.
Assistant Examiner—Sharon D. Logan
Attorney, Agent, or Firm—Patrick T. King; Martin C. Fliesler; J. Vincent Tortolano

[57] ABSTRACT

A folding-type A/D converter for converting an analog input signal to an n-bit digital code, the A/D converter having a transfer function dividing the analog input signal into at least $n-1$ segments, each such $n-1$ segment having an amplitude level corresponding to the significance of a given bit of the digital code and having linear parts which are mirror images of one another extending over $2^n$ transition levels L. The A/D converter includes voltage-current converters for converting voltage input signals to current signals, a plurality of circuit stages for producing the linear parts in the current domain in response to the current signals, and a converter for converting the linear parts to a logic 1 or logic 0 of the bits of the digital code.

21 Claims, 12 Drawing Figures

TABLE III

| BIT | 3 | 2 | 1 | 0 |
|-----|---|---|---|---|
| $L_1$ | 0 | 0 | 0 | 0 |
| $L_2$ | 0 | 0 | 0 | 1 |
| $L_3$ | 0 | 0 | 1 | 0 |
| $L_4$ | 0 | 0 | 1 | 1 |
| $L_5$ | 0 | 1 | 0 | 0 |
| $L_6$ | 0 | 1 | 0 | 1 |
| $L_7$ | 0 | 1 | 1 | 0 |
| $L_8$ | 0 | 1 | 1 | 1 |
| $L_9$ | 1 | 0 | 0 | 0 |
| $L_{10}$ | 1 | 0 | 0 | 1 |
| $L_{11}$ | 1 | 0 | 1 | 0 |
| $L_{12}$ | 1 | 0 | 1 | 1 |
| $L_{13}$ | 1 | 1 | 0 | 0 |
| $L_{14}$ | 1 | 1 | 0 | 1 |
| $L_{15}$ | 1 | 1 | 1 | 0 |
| $L_{16}$ | 1 | 1 | 1 | 1 |

FOLDING-TYPE ANALOG-TO-DIGITAL CONVERTER

BACKGROUND OF THE INVENTION

1. Technical Field

The present invention relates generally to analog-to-digital (A/D) converters and, more particularly, to a folding-type A/D converter.

2. Background Art

For a wide variety of systems that process information digitally, the need to convert analog signals to digital signals is essential. Consequently, analog-to-digital (A/D) converters of many types have been developed to convert the analog signal to a digital representation of this signal. Generally, a typical A/D converter will generate a transfer function that divides the analog signal into a plurality of amplitude levels and produces digital codes of n-bit length representing the respective amplitude levels of the analog signal.

A folding-type A/D converter is one type of well-known converter that is used in many systems. The folding-type A/D converter produces a digital code that has the property of "unit distance", which property means that only one bit changes at a time as the amplitude of the analog signal changes from one level to the next, as will be described more fully below. This type of converter typically uses several signal processors that process an analog input signal by generating a transfer function which divides the input signal range into a number of linear segments depending on the number, n, of bits in the code. For example, for a code of n-bit length, there are n linear segments. Each linear segment corresponds to a bit in the code from the least significant bit to the most significant bit, and has an amplitude range corresponding to the weight or significance of each such bit. For example, and as will also be further described below, the linear segment corresponding to the least significant bit, e.g., bit 0, will have one amplitude range, the linear segment corresponding to the next significant bit, or bit 1, will have another amplitude range, etc.

As will be further described also, the converter is a "folding-type" in that the linear segments for the respective $n-1$ most significant bits are folded or repeated over the range of $2^n$ bit transition levels L. For example, in a 4-bit code, there are 16 bit transition levels L over which the linear segments for the respective $n-1$ most significant bits are repeated. The linear segment corresponding to the most significant bit, however, does not repeat, i.e., there is only one, non-repetitive linear segment corresponding to the most significant bit.

U.S. Patent No. 4,058,806 discloses a folding-type A/D converter which directly converts an analog voltage input signal to a digital code. In this patent, the folded linear segments of the transfer function for a given bit are generated in the voltage domain, i.e., as voltages, by using diodes that are connected in AND-OR configurations. These generated folded segments are then directly compared with a threshold voltage by a comparator, whereby the output of the comparator is a logic 1 or logic 0 for the given bit. One problem with this prior A/D converter is that the diodes used to generate the folded linear segments must match exactly; otherwise, there will be a degradation in the linearity of the folded linear segments. In addition, since this converter operates in the voltage domain, multiple amplifiers or, alternatively, multiple buffers, are used in order to mitigate undesirable loading that is caused by the diode network, thereby increasing the number of components, cost and complexity of the converter.

Another folding-type A/D converter is disclosed in a publication entitled "Fast ADC", by Arbel and Kurz, *IEEE Transactions on Nuclear Science*, Vol. NS-22, February, 1975. In this converter, a given linear segment of the transfer function is generated and repeated for a bit of given significance by utilizing current differencing amplifiers, each of which responds to an input analog voltage input signal. A given differential pair of amplifiers is connected such that as the input voltage signal passes through a range of $\Delta V$ volts, an output current is produced corresponding to the linear segment. By connecting a number of these differential pairs of amplifiers as described in this publication, segment folding or repeating is obtained in increments of $\Delta V$ volts. The resulting output currents of these differential pairs of amplifiers, representing the repeating segments of the transfer function for a given bit, are then converted to a voltage and fed to an external "flash" A/D converter where the folded signal is then digitized.

While the folding-type A/D converter of Arbel and Kurz operates in the current domain for generating the transfer function and, therefore, does not have the problems associated with the above-mentioned U.S. Pat. No. 4,058,806 which operates in the voltage domain, the former does have several disadvantages. First, the analog voltage input signal is actively processed, i.e., amplified, by the differential pairs of amplifiers. In addition to requiring a large number of differential amplifiers, this active processing of the input signal greatly increases the possibilty of error. Secondly, the digital code is not produced directly from the linear segments of the transfer function. Rather, a given segment is digitized by the external "flash" A/D converter, thereby requiring additional circuitry for the overall A/D conversion process. Still furthermore, the overall voltage range of the converter of Arbel and Kurz is determined largely by the response range of the differential pairs of amplifiers. Consequently, the initial setup of this converter requires fine-tuning for obtaining precise $\Delta V$ ranges, which is difficult to accomplish. Still furthermore, even if the initial setup is accomplished successfully, these differential amplifiers are prone to temperature drift, thereby affecting the precision of $\Delta V$.

SUMMARY OF THE INVENTION

The present invention is a folding-type A/D converter for converting an analog input signal to an n-bit digital code and has a transfer function for dividing the analog input signal into at least one given segment corresponding to a bit of a given significance. The converter includes means for producing an analog current signal in response to the analog input signal; means, having one path and another path, for switching the analog current signal between the one path and the other path, in which the analog current signal in the one path corresponds to the given segment; and means, responsive to the current in the one path, for producing the given bit of the digital code.

The present invention produces each segment of the transfer function in the current domain and actively processes the analog input signal only in a limited manner, thereby minimizing the number of active components in the overall converter. That is, the input signal is actively processed only to produce or convert it to the analog current signal. Thereafter, this analog current signal is merely switched, e.g., not amplified, between one path and the other path by the switching means. Furthermore, the converter of the present invention directly produces the digital code by responding to the current in the one path corresponding to the given segment without the need for an external A/D converter such as the "flash" converter.

BEST MODE CARRYING OUT THE INVENTION

The principles of the present invention have applicability generally to folding-type A/D converters for converting an analog signal to a digital code of n-bit length. That is, these principles are used in an n-bit, folding-type A/D converter. However, as one example, the present invention will be described in connection with a 4-bit folding-type A/D converter. Furthermore, the principles of the present invention have applicability to digital codes generally. Two examples of such digital codes that will be described are the Gray code, which is a unit-distance code, and the straight binary code which is not a unit-distance code.

Figure 1A:
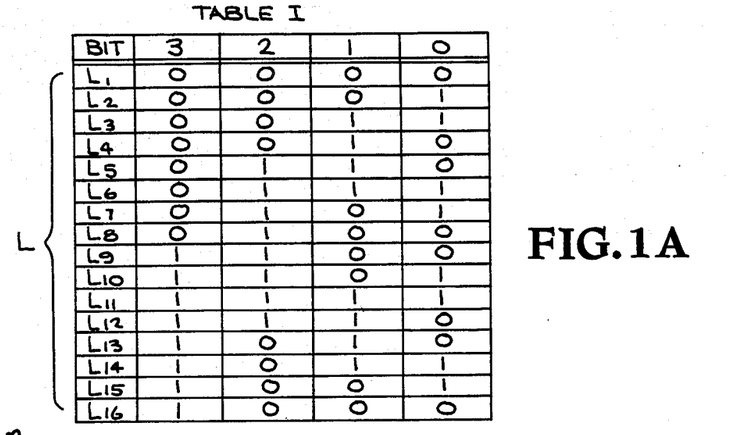
FIG. 1A is a table showing one type of digital code used in the folding-type A/D converter of the present invention.

FIG. 1A illustrates a Table I of a 4-bit Gray code for encoding sixteen amplitude intervals bounded by transition levels L, shown as numbered $L_1$–$L_{16}$, of an analog input signal. For each bit of given significance of the code, such as the least significant bit (LSB) or bit 0, a repeating sequence or pattern occurs over the range of levels $L_1$–$L_{16}$. Thus, for example, for bit 0, the repeating sequence is the logic pattern 0110 over levels $L_1$–$L_{16}$. As another example, for the next most significant bit, i.e., bit 1, the repeating logic pattern is 00111100.

Figure 1B:
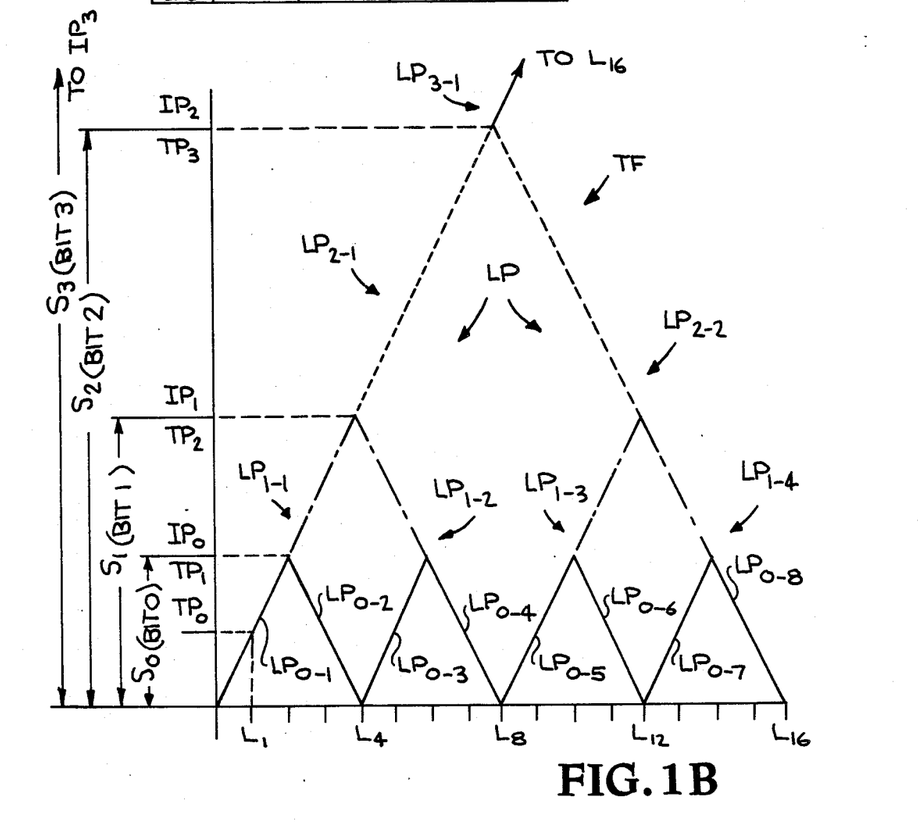
FIG. 1B is an illustration of the transfer function generated by the A/D converter of the present invention for the digital code of FIG. 1A.

FIG. 1B illustrates a well-known transfer function TF having characteristics which will be described in detail for a better understanding of the present invention. The transfer function TF divides the analog input signal to be converted to the digital code of FIG. 1A into n segments $S_0$–$S_3$. The segments $S_0$–$S_2$ are shown as a function of the levels $L_1$–$L_{16}$ and have folded, linear parts shown generally at LP, as will be further described. The segment $S_3$ is not folded and is only partially shown, as will be further described below.

The amplitude or extent of each segment $S_0$–$S_2$ corresponds to the weight or significance of the respective bits 0–2 of the Gray code of FIG. 1A. Specifically, the amplitude or extent of each segment $S_0$–$S_2$ is such that for the corresponding bit 0–2, the respective segments $S_0$–$S_2$ extend from a base amplitude level of the analog input signal, e.g., zero, to inflection points $IP_0$–$IP_2$ corresponding to the amplitude of the analog input signal where the next most significant bit 0–2 changes. That is, the segment $S_0$ extends from a base level zero to the inflection point $IP_0$ at which the next most significant bit, i.e., bit 1, changes from logic 0 to logic 1, as shown also in Table I of FIG. 1A from level $L_2$ to level $L_3$. Segment $S_1$ extends from the base level zero to an inflection point $IP_1$ at which the next most significant bit, i.e., bit 2, changes from logic 0 to logic 1 as shown also in TABLE I of FIG. 1A from level $L_4$ to level $L_5$. Segment $S_2$ extends from the base level zero to the inflection point $IP_2$ at which the most significant bit, i.e., bit 3, changes, as also shown in Table I of FIG. 1A from level $L_8$ to level $L_9$.

In more general terms, the segments $S_0$–$S_2$ undergo an inflection at respective inflection points $IP_0$–$IP_2$ as a binary multiple of a number of bits or levels L, where the span of each level, L, is $V_{LSB}$ which is equal to $V_{FS}/2^n$, where $V_{FS}$ is the full scale input voltage of an A/D converter. The inflection point, $IP_m$, for each bit is equal to $V_{LSB} \cdot 2^{m+1}$, where m is the significance of the bit as determined by its position. Thus, for the least significant bit, LSB, or bit 0, the inflection point $IP_0$ occurs when the amplitude of the analog input signal exceeds two bits or levels L of the least significant bit, i.e., above level $L_2$, when the next most significant bit 1 changes from a logic 0 to a logic 1. For bit 1, the inflection point $IP_1$ occurs when the analog input signal exceeds four bits or levels L of the least significant bit LSB, i.e., when the next most significant bit 2 changes from logic 0 to logic 1 above level $L_4$. For bit 2, the inflection point $IP_2$ occurs at eight bits of the least significant bit LSB, i.e., when the most significant bit 3 changes from logic 0 to logic 1 above level $L_8$.

Each given segment $S_0$–$S_2$ of the transfer function TF has a threshold point TP below which the corresponding bit 0–2 of the Gray code of FIG. 1A is a logic 0 and above which the corresponding bit 0–2 is a logic 1. The threshold point, $TP_m$, for each bit, is equal to $V_{LSB} 2^m$. Thus, for segment $S_0$ and bit 0 of the Gray code, the threshold point $TP_0$ occurs at one LSB, so that bit 0 is at logic 0 below this threshold point $TP_0$ and at logic 1 above $TP_0$, as can also be seen in Table I of FIG. 1A. For segment $S_1$ and bit 1, the threshold point $TP_1$ is at two LSB's, which coincides with the inflection point $IP_0$, resulting in bit 1 being at logic 0 up to the threshold point $TP_1$ for two bits of bit 1, and then being logic 1 up to the inflection point $IP_1$. For bit 2, the threshold point $TP_2$ occurs at four LSB's, which coincides with the inflection point $IP_1$.

As indicated above, each segment $S_0$–$S_2$ for the corresponding bit 0–2 repeats, i.e., is folded, over the amplitude range of the transfer function TF, i.e., over levels $L_1$–$L_{16}$. Thus, segment $S_0$ has one linear part $LP_{0-1}$, another linear part $LP_{0-2}$ which is a folded or mirror image of the preceding part $LP_{0-1}$, yet another part $LP_{0-3}$ which is a mirror image of part $LP_{0-2}$, and so on, all of which are shown in solid lines. These are commonly referred to as the "min-terms" of the code.

Segment $S_1$ has a linear part $LP_{1-1}$, another linear part $LP_{1-2}$ which is a mirror image of part $LP_{1-1}$, and so on, all of which are shown in combined solid-chain lines. Segment $S_2$ has one linear part $LP_{2-1}$ and another linear part $LP_{2-2}$ which is a mirror image of part $LP_{2-1}$, as shown in solid-chain-dash lines. As will be further described, in accordance with the present invention, each such linear part of the entire transfer function TF is generated in the current domain.

In connection with the most significant bit, MSB, of any code, such as bit 3 shown in TABLE I of FIG. 1A, there is no repeating pattern. Accordingly, FIG. 1B shows partially the segment $S_3$ which has only one linear part $LP_{3-1}$ which would extend in the direction of the arrow to the full scale level $L_{16}$ of the converter to be described below, at which level an inflection point $IP_3$ would otherwise occur. Segment $S_3$ has a threshold point $TP_3$ at half scale, i.e., at level $L_8$ coinciding with inflection point $IP_2$.

Figure 2A:
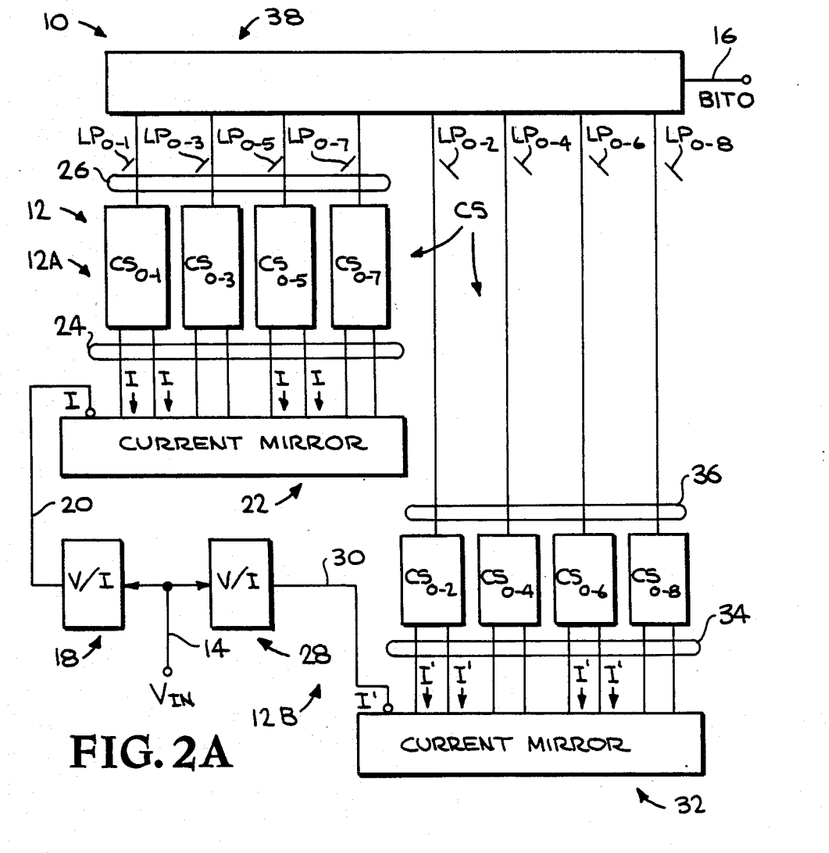
FIG. 2A is a block diagram of certain circuitry of the A/D converter of the present invention for use in connection with the transfer function of FIG. 1B.

FIG. 2A shows a portion of a folding-type A/D converter 10 of the present invention, particularly circuitry shown generally at 12 for converting an analog voltage input signal $V_{IN}$ on an input line 14 to the logic 1 or logic 0 for bit O, i.e., the least significant bit LSB, on an output line 16. Circuitry 12 includes a section 12A having means 18 for converting the voltage input signal $V_{IN}$ on line 14 to an analog current signal I on a line 20. A current mirror means 22 responds to the analog current signal I by outputting respective "tail" current signals I on respective lines shown generally at 24 of the same magnitude as current signal I on line 20.

Section 12A has a plurality of similar circuit stages shown generally at CS, particularly stages $CS_{0-1}$, $CS_{0-3}$, $CS_{0-5}$ and $CS_{0-7}$, for generating the respective linear parts $LP_{0-1}$, $LP_{0-3}$, etc., of the segment $S_0$ on respective output lines shown generally at 26. These linear parts $LP_{0-1}$, $LP_{0-3}$, etc., are generated in the current domain on respective lines 26 in response to the tail current signals I on lines 24.

Circuitry 12 also includes a section 12B having means 28 for converting the voltage input signal $V_{IN}$ on line 14 to an analog current signal I' on a line 30 different than current signal I on line 20, as will be further described. A current mirror means 32 responds to the analog current signal I' by outputting respective tail current signals I' on respective lines shown generally at 34 of the same magnitude as current signal I' on line 30.

Section 12B also has circuit stages CS which include stages $CS_{0-2}$, $CS_{0-4}$, $CS_{0-6}$ and $CS_{0-8}$, for generating the respective linear parts $LP_{0-2}$, etc., of the segment $S_0$ on respective output lines shown generally at 36. These linear parts $LP_{0-2}$, etc., are also generated in the current domain in response to the tail current signals I' on lines 34.

Figure 2B:
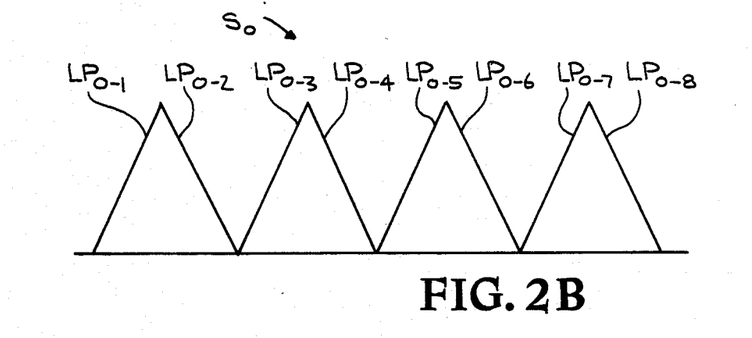
FIG. 2B is a graph used to explain a portion of the transfer function shown in FIG. 1B generated by the circuitry of FIG. 2A.

FIG. 2B shows the combined linear parts $LP_{0-1}$–$LP_{0-8}$ of segment $S_0$. As will be further described, the current stages $CS_{0-1}$–$CS_{0-8}$ will generate the linear parts $LP_{001}$–$LP_{0-8}$, respectively, as shown in FIG. 2B, in dependence on the amplitude level of the voltage input signal $V_{IN}$.

Circuitry 12 also includes means 38 for producing the logic 0 or logic 1 of bit 0 on the line 16 in response to the linear parts $LP_{0-1}$–$LP_{0-8}$ received on lines 26 and lines 36, as will be further described. This means 38, as may be seen, is common to section 12A and section 12B.

Figure 3A:
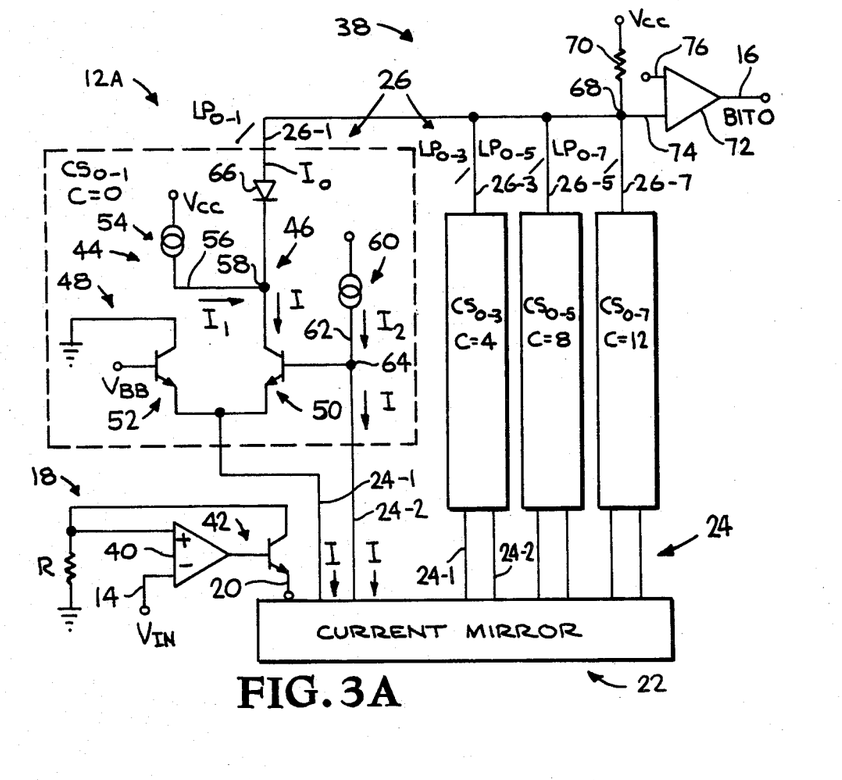
FIG. 3A is a schematic and block diagram of partial circuitry of the A/D converter of FIG. 2A.
Figure 3B:
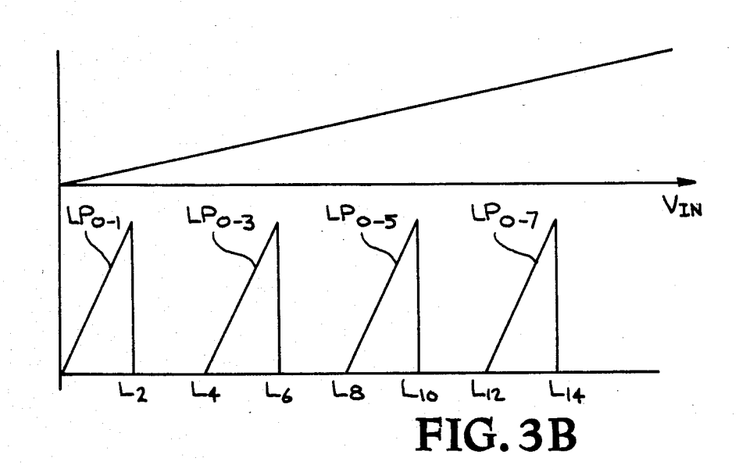
FIG. 3B is a graph used to explain a portion of the transfer function shown in FIG. 2B generated by the partial circuitry of FIG. 3A.

FIG. 3A shows in more detail section 12A of the folding-type A/D converter 10 of the present invention, together with the common means 38. FIG. 3B shows the linear parts $LP_{0-1}$, $LP_{0-3}$, etc., that are generated by circuit stages $CS_{0-1}$, $CS_{0-3}$, etc., in dependence on the analog voltage input signal $V_{IN}$.

The voltage-current converter means 18 of section 12A includes, for example, an amplifier 40 having a (+) input coupled to ground through a resistor R and a (−) input coupled to line 14 carrying $V_{IN}$. In this example, $V_{IN} < 0$. The output of amplifier 40 base drives a transistor 42 whose emitter is coupled to line 20 and whose collector is fed back to the (+) input. Thus, voltage-current converter means 18 produces the current I=−$V_{IN}/R$, as does, therefore, the current mirror means 22 on respective lines 24.

Circuit stage $CS_{0-1}$ of section 12A includes means shown generally at 44, having one path 46 leading to an output line 26-1 and another path 48 leading to ground, for switching the current signal I on a line 24-1 to the one path 46 or the other path 48. The means 44 preferably includes a differential pair of transistors 50 and 52 whose emitters are coupled in common to line 24-1. Means 44 also has a current source 54 producing a current $I_1$ of magnitude C ($V_{LSB}/R$) on a line 56 which is coupled to a node 58 connected to the collector of transistor 50. Current source 54 supplies the current $I_1$ to node 58 to "buck" or oppose the tail current signal I switched into path 46 via transistor 50. Another current source 60 provides a current $I_2$ of magnitude (C+P) $V_{LSB}/R$ on a line 62 to base bias the transistor 50 via a node 64 that also receives the current I from a line 24-2. Also shown is a controllable device such as a diode 66, coupled in path 46 between node 58 and output line 26-1, through which a diode current $I_D = (I - I_1)$ at node 58 can flow. The diode 66 is controllable in that it can be forward or reverse biased, as will be described below.

As will become apparent, the value C of the current source 54, for each circuit stage $CS_{0-1}$, $CS_{0-3}$, etc., is different for each such circuit stage. However, the value P of C+P of the current source 60 is constant for each such circuit stage $CS_{0-1}$, $CS_{0-3}$, etc. For circuit stage $CS_{0-1}$, the value C is zero, while the values C for the other circuit stages $CS_{0-3}$, etc., will be given below. The value P is equal to 2, which means that P corresponds to two amplitude transition levels L above the value C.

In the operation of circuit stage $CS_{0-1}$ for generating the linear part $LP_{0-1}$ of the segment $S_0$, assume that the analog voltage input signal $V_{IN}$ increases from 0 volts as shown in FIG. 3B. As the voltage input signal $V_{IN}$ begins to increase, the tail current signal I on line 24-1 begins to increase proportionally. At this time, the base-to-emitter voltage of the transistor 50 is such that this transistor 50 is on and transistor 52 is off. Accordingly, the tail current signal on line 24-1 is coupled over path 46 through transistor 50 to node 58. The current I in path 46 at node 58 exceeds the bucking current $I_1$ of value zero so that diode 66 is forward-biased and the difference current $I_D$ flows through diode 66 and on output line 26-1. Thus, as the voltage input signal $V_{IN}$ increases, the tail current I on line 24-1 increases as does, accordingly, the current on line 26-1 which corresponds to the linear part $LP_{0-1}$ shown in FIG. 3B.

Thereafter, when the tail current signal I on line 24-2 increases in response to the increasing voltage input signal $V_{IN}$ to a magnitude equal to $(C+P) V_{LSB}/R$ provided by current source 60, transistor 50 turns off and transistor 52 turns on. Consequently, the tail current signal I on line 24-1 is switched over path 48 through transistor 52 to ground. Accordingly, the current on line 26-1 abruptly drops to 0, as shown in FIG. 3B at level $L_2$.

Each other circuit stage $CS_{0-3}$, $CS_{0-5}$ and $CS_{0-7}$ is identical to circuit stage $CS_{0-1}$, except for the value C, as mentioned above. The current source 54 of circuit stage $CS_{0-3}$ has a value $C=4$ corresponding to level $L_4$, the current source 54 of circuit stage $CS_{0-5}$ has a value $C=8$ corresponding to level $L_8$ and the current source 54 of circuit stage $CS_{0-7}$ has a value $C=12$ corresponding to level $L_{12}$.

Accordingly, circuit stage $CS_{0-3}$ generates the linear part $LP_{0-3}$ of segment $S_0$ in the following manner. As the voltage input signal $V_{IN}$ increases from zero to level $L_4$, transistor 50 will be turned on, so that the tail current signal I on line 24-1 coupled to circuit stage $CS_{0-3}$ will flow through transistor 50 to node 58. However, current source 54 is producing a current $I_1$ of a magnitude greater than the tail current signal I from line 24-1 since $C=4$. Accordingly, diode 66 is reverse-biased at this time, so that no current $I_D$ is outputted on line 26-3. Then, as the voltage input signal $V_{IN}$ further increases above level $L_4$, the tail current signal I at node 58 exceeds $I_1$, resulting in current $I_D$ flowing through diode 66, corresponding to linear part $LP_{0-3}$. Thereafter, when the voltage input signal $V_{IN}$ increases so that the tail current signal I on line 24-2 reaches current $I_2$, transistor 50 turns off and transistor 52 turns on, so that the tail current signal I on line 24-1 now flows through transistor 52 of stage $CS_{0-3}$ to ground. Accordingly, the current $I_D$ on line 26-3 and, hence, part $LP_{0-3}$, drops abruptly to zero, as shown at level $L_6$ in FIG. 3B.

The current source 54 of circuit stage $CS_{0-5}$ has a value $C=8$ corresponding to level $L_8$ and the current source 54 of circuit stage $CS_{0-7}$ has a value $C=12$ corresponding to level $L_{12}$, as previously mentioned. In a similar manner, therefore, circuit stage $CS_{0-5}$ and $CS_{0-7}$ generate their respective linear parts $LP_{0-5}$ and $LP_{0-7}$ on their respective output lines 26-5 and 26-7 as voltage input signal $V_{IN}$ increases as shown in FIG. 3B.

The converter 10, as shown in FIG. 3A, includes the means 38 for producing a logic 0 or logic 1 of bit 0 on the output line 16 in response to the respective currents $I_D$ on respective lines 26-1, 26-3, etc. Means 38 includes a summing junction 68 that sums the respective currents $I_D$ on lines 26, together with a resistor 70 for converting the summed current $I_D$ at junction 68 to a summed voltage signal. A comparator 72 has one input coupled to the summing junction 68 over a line 74 and another input coupled to a line 76 carrying a threshold voltage input signal corresponding to the threshold point $TP_0$ shown in FIG. 1B.

Thus, as the voltage input signal $V_{IN}$ increases from zero volts, the circuit stage $CS_{0-1}$ will produce a first current $I_D$ of increasing magnitude on line 26-1 resulting in a summed voltage signal at junction 68 below the threshold voltage signal on line 76. Consequently, the level $L_1$ of bit 0 is logic 0 on output line 16, as also shown in FIG. 1A. Then, as the voltage input signal $V_{IN}$ increases and the circuit stage $CS_{0-1}$ produces an increasing current $I_D$ on line 26-1 resulting in a summed voltage signal at junction 68 above the threshold voltage signal on line 76, the comparator 72 will produce a logic 1 on line 16 corresponding to the level $L_2$ of bit 0, as shown in FIG. 1A. As the voltage input signal $V_{IN}$ further increases, comparator 72 will respond similarly to the summed voltage signal at junction 68 resulting from the currents $I_D$ on the respective lines 26-3, 26-5, 26-7 to provide on line 16 the associated logic 0 or logic 1 of bit 0 for the corresponding levels L.

Figure 4A:
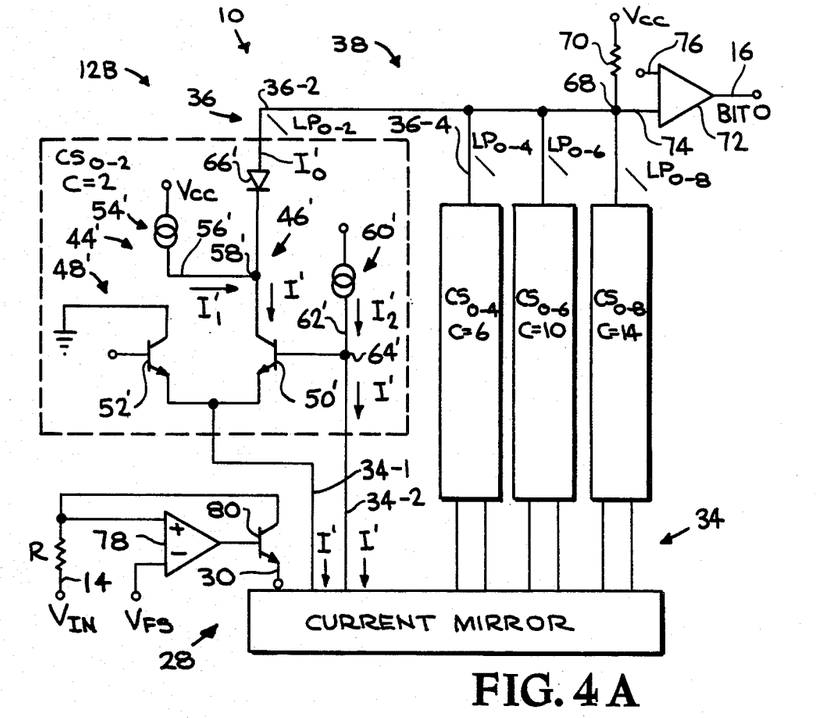
FIG. 4A is a schematic and block diagram of other circuitry of the A/D converter of FIG. 2A.
Figure 4B:
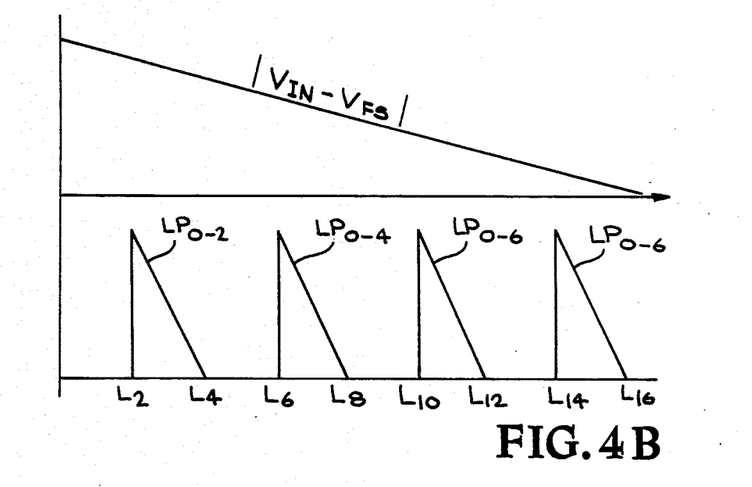
FIG. 4B illustrates a graph used to explain another portion of the transfer function shown in FIG. 2B generated by the circuitry of FIG. 4A.

FIG. 4A shows in more detail the section 12B of the folding-type A/D converter 10 of the present invention for generating the linear parts $LP_{0-2}$, $LP_{0-4}$, $LP_{0-6}$ and $LP_{0-8}$ of the transfer function TF, together with the common means 38. FIG. 4B shows the linear parts $LP_{0-2}$, $LP_{0-4}$, etc., that are generated in dependence on the analog voltage input signal $V_{IN}$.

The voltage-converter means 28 of section 12B includes, for example, an amplifier 78 having a (+) input coupled to line 14 carrying $V_{IN}$ via a resistor R. The (−) input of amplifier 78 receives a voltage $V_{FS}$ which, as previously mentioned, is the full-scale voltage or range of converter 10. In this example, $V_{IN}<0$ and $V_{FS}<0$. The output of amplifier 78 drives a transistor 80 whose emitter is coupled to line 30 and whose collector is fed back to the (+) input. Thus, voltage-current converter means 28 produces the current $$I' = \frac{|V_{IN} - V_{FS}|}{R}$$

as does, therefore, the current mirror means 32 on lines 34.

As shown schematically, the circuit stage $CS_{0-2}$, and the other circuit stages CS of section 12B, have components that are similar to those used for circuit stage $CS_{0-1}$ and the other circuit stages CS of section 12A, as shown by similar reference numerals. However, each current source 54' produces a current $I'_1$ of magnitude $(M-C)V_{LSB}/R$ and each current source 60' produces a current $I'_2$ of magnitude $M-(C+P)V_{LSB}/R$. The value M is the same for each circuit stage CS of section 12B and is equal to $2^n$, i.e., $M=16$ for the 4-bit converter 10. The value C for circuit stage $CS_{0-2}$ is 2, for circuit stage $CS_{0-4}$ is 6, for circuit stage $CS_{0-6}$ is 10 and for circuit stage $CS_{0-8}$ is 14.

In the operation of circuit stage $CS_{0-2}$, and with reference to FIG. 4B also, as the voltage input signal $V_{IN}$ increases, the current I' decreases from a maximum value. Until the current I' on line 34-2 falls below the current $I'_2$ produced by source 60', the transistor 50' is turned off and transistor 52' is turned on, so that the tail current signal I' on line 34-1 is coupled to ground through path 48'. Then, as soon as the tail current signal I' on line 34-2 falls below the current $I'_2$, transistor 50' turns on and transistor 52' turns off. Consequently, the tail current signal I' on line 34-1 is now switched via transistor 50' onto path 46'. The difference current $I'_D$ at node 58' between the tail current signal I' and the current $I'_1$ produced by source 54' is such that diode 66' is forward-biased, whereby $I'_D$ is coupled through diode 66' onto line 36-2. Initially, this difference current $I'_D$ is a maximum, as indicated at level $L_2$ in FIG. 4B. Thereafter, as I' decreases, the difference current $I'_D$ decreases until I' falls below $I'_1$. At this point, diode 66' becomes reverse-biased, so that $I'_D$ on line 36-2 is zero, corresponding to level $L_4$ as shown in FIG. 4B. Thus, at this point, the generation of the part $LP_{0-2}$ has been completed.

In a similar manner, the other circuit stages $CS_{0-4}$, $CS_{0-6}$ and $CS_{0-8}$ produce their respective parts $LP_{0-4}$, $LP_{0-6}$ and $LP_{0-8}$ of the transfer function TF for bit 0. The only difference between these circuit stages and circuit stage $CS_{0-2}$, as indicated above, is the value of C, as indicated above. Thus, for example, circuit stage $CS_{0-4}$ will produce on its output line 36-4 no current until level $L_6$ is reached and then commence producing the decreasing current $I'_D$ at level $L_6$ until level $L_8$ is reached, thereby generating part $LP_{0-4}$.

As with the circuit stages $CS_{0-1}$, etc., of section 12A of FIG. 3A, the output currents $I'_D$ on respective lines 36 of the circuit stages $CS_{0-2}$, $CS_{0-4}$, etc., are coupled to the summing junction 68 of means 38. Thus, comparator 72 will produce the logic 1 or logic 0 value for bit 0 in response to the respective linear parts $LP_{0-2}$, $LP_{0-4}$, etc.

The above discussion has shown the circuitry 12 and manner in which bit 0 is produced for the Gray code of FIG. 1A. Other similar circuitry, not illustrated, is used to produce bits 1–3, as summarized in TABLE II as follows:

TABLE II

| | Bit | Value of C | P | Number of Circuit Stages CS |
|---|---|---|---|---|
| A. | 0 (LSB) | 0,2,4,6,8,10,12,14 | 2 | 8 |
| B. | 1 | 0,4,8,12 | 4 | 4 |
| C. | 2 | 0,8 | 8 | 2 |
| D. | 3 (MSB) | — | — | 0 comparator only |

In general, TABLE II shows that the spacing or difference for a given bit 0–3 between the respective values of C is equal to $2^{m+1}$, and that P is also equal to this spacing of $2^{m+1}$.

Line A of TABLE II summarizes for bit 0 the values C for the respective eight stages $CS_{0-1}$–$CS_{0-8}$, in which the spacing between each value of C is 2, and P=2. Line B indicates for bit 1 that there are four stages $CS_{1-1}$–$CS_{1-4}$ (not shown) corresponding, respectively, to parts $LP_{1-1}$–$LP_{1-4}$ shown in FIG. 1B. Line B also shows the values C for respective stages $CS_{1-1}$–$CS_{1-4}$, in which the spacing between each value of C is 4, and P=4.

Line C indicates for bit 2 that there are two stages $CS_{2-1}$–$CS_{2-2}$ (not shown) corresponding, respectively to parts $LP_{2-1}$–$LP_{2-2}$ shown in FIG. 1B. Line C also shows the values C for these two respective stages, in which the spacing between each value of C is 8, and P=8.

Also, for each bit 0–2, a corresponding means 38 having, for example, a comparator 72 and resistor 70, is required. Thus, the total number of stages CS for bits 0–2 is fourteen and the total number of comparators 72 is three.

Line D shows that for the most significant bit (MSB) or bit 3, only a simple comparator (not shown) having a threshold voltage corresponding to threshold point $TP_3$ and inflection point $IP_2$ (see FIG. 1B) is required. When $V_{IN}$ is below $IP_2$, bit 3 is logic 0 and when above $IP_2$, bit 3 is logic 1, as shown in TABLE I of FIG. 1A.

Also, the overall 4bit A/D converter 10 requires only the two voltage-current converter means 18 and 28 for producing, respectively, current I and current I'. As shown, therefore, the voltage input signal $V_{IN}$ is actively processed by only two respective amplifiers 40 and 78. Furthermore, only two current mirror means 22 and 32 are required for the overall converter 10.

The above-described circuitry is relatively simple for a 4-bit folding-type A/D converter 10. For an 8-bit folding-type A/D converter 10, the number of circuit stages CS would be 254, which is relatively large. To reduce this number of stages, dual rank 4-bit converters 10 can be used, requiring only twenty-eight stages CS. For exmaple, in such a dual rank converter, the LSB output of the upper 4-bit converter producing bits 4–7 may be used as the input to the lower 4-bit converter producing bits 0–3, with each converter operating at double speed. As an alternative to operating at this double speed, pipelining techniques can be employed, in which the upper 4-bit converter would process a new sample of $V_{IN}$ while the lower 4-bit converter would process the previous sample of $V_{IN}$.

Figure 5A:
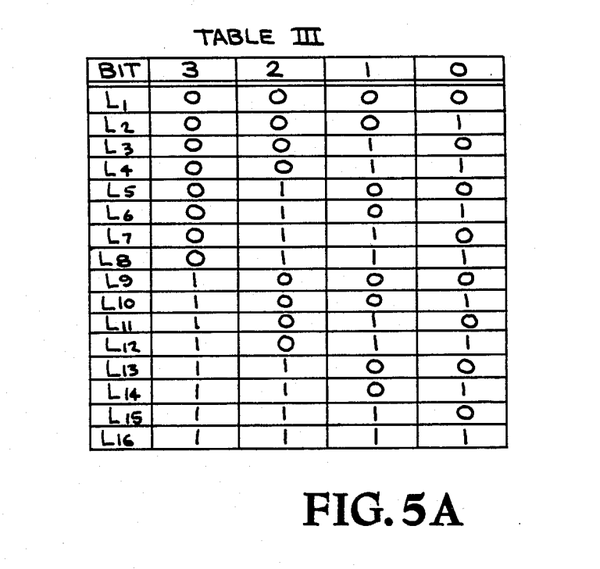
FIG. 5A is a table of another digital code that may be used by the A/D converter of the present invention.
Figure 5B:
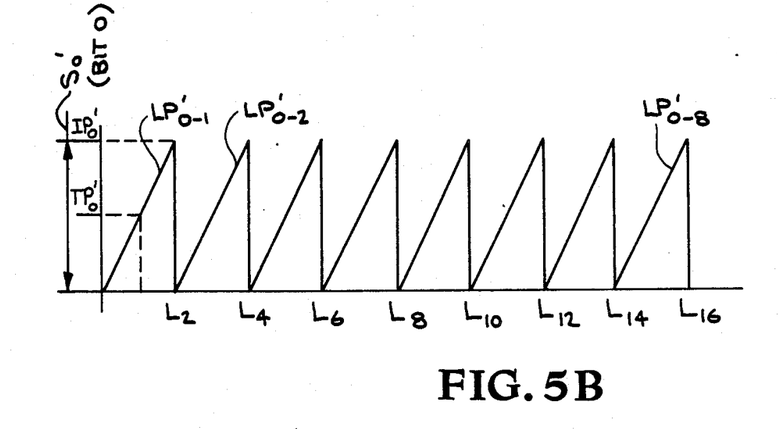
FIG. 5B shows a portion of a transfer function which is generated by the A/D converter of the present invention for the digital code of FIG. 5A.

As previously mentioned, the principles of the present invention can also be applied to a straight binary code, such as the 4-bit code shown in TABLE III of FIG. 5A. This code also is based on a repeating sequence of logic 0's and logic 1's, as shown, for example, in the repeating sequence 01 of the least significant bit LSB or bit 0. FIG. 5B shows the portion of the transfer function TF corresponding to bit 0. This portion has a segment $S'_0$ having an inflection point $IP'_0$, together with a threshold point $TP'_0$, below which bit 0 is logic 0 and above which bit 0 is logic 1. The segment $S'_0$ has repeating linear parts $LP'_{0-1}$–$LP'_{0-8}$ which are not mirror images of one another as are those of the transfer function TF of FIG. 1B, but rather are the same.

Figure 6A:
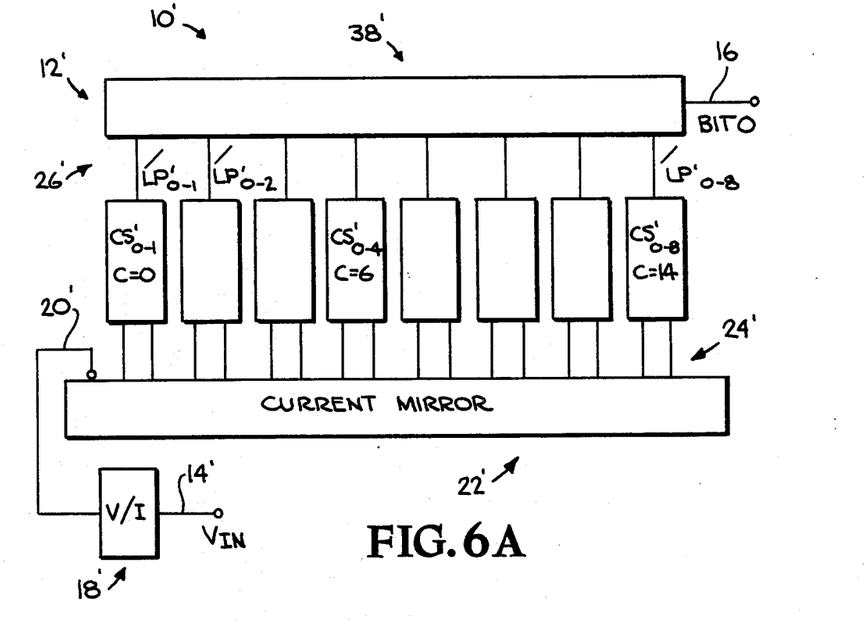
FIG. 6A is a block diagram of circuitry of the A/D converter of the present invention for use in connection with the transfer function of FIG. 5A.
Figure 6B:
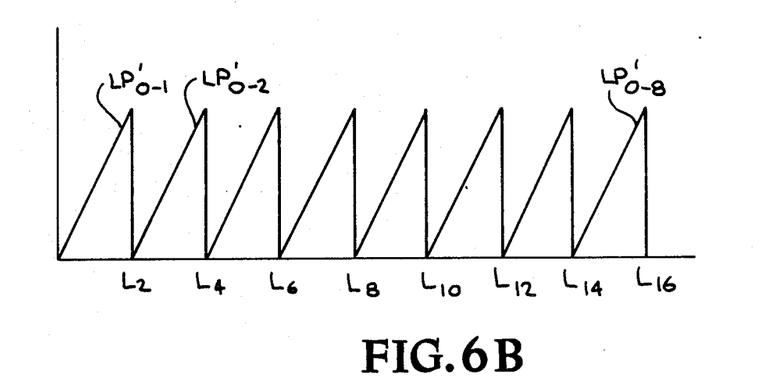
FIG. 6B illustrates the portion of the transfer function produced by the circuitry of FIG. 6A.

FIG. 6A illustrates circuitry 12' of a 4-bit folding-type A/D converter 10' for producing bit 0 on an output line 16' in response to a voltage input signal $V_{IN}$ on a line 14'. Circuitry 12' is similar to section 12A of FIG. 3A in that it has voltage-current converter means 18', current mirror means 22' and means 38' which are the same as the means 18, means 22 and means 38 in section 12A. Circuitry 12' also has eight circuit stages $CS'_{0-1}$–$CS'_{0-8}$, all of which are the same as circuit stage $CS_{0-1}$ shown in FIG. 3A except for the value C. These circuit stages $CS_{0-1}$–$CS_{0-8}$ have respective values of C=0, 2, 4, 6, 8, 10, 12 and 14. As a result of having these values C, the respective circuit stages $CS_{0-1}$–$CS_{0-8}$ will produce on output lines 26' the respective linear parts $LP'_{0-1}$–$LP'_{0-8}$ in dependence on $V_{IN}$, which parts are also shown in FIG. 6B. Similar circuitry (not shown) is utilized for generating the entire transfer function TF for the straight binary code and for producing bits 1–2, with only a simple comparator (not shown) being required for producing bit 3.

The folding-type A/D converter 10 or 10' of the present invention can be implemented, for example, as an integrated circuit using bipolar technology, as illustrated. However, the converter 10 or 10' can also be applied to other technologies, such as CMOS. Furthermore, the converter 10 or 10' is inherently a parallel converter, in that each bit of the n-bit code can be essentially encoded independently of any other bit, thereby making the converter fast relative to a sequential converter.

Finally, each linear part LP generated by the specific converter 10 or converter 10' is actually inverted from that illustrated. For example, the linear part $LP_{0-3}$ shown in FIG. 3B would start at level $L_4$ and then extend downwardly to an inflection point at level $L_6$.

Each linear part LP has been shown non-inverted for ease of explanation and understanding of the invention.

The foregoing description of a preferred embodiment of the invention has been presented for purposes of illustration and description. It is not intended to be exhaustive or to limit the invention to the precise form disclosed, and obviously many modifications and variations are possible in light of the above teaching. The embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

I claim:

1. A folding-type A/D converter for converting an analog input signal to an n-bit digital code, the A/D converter having a transfer function dividing the analog input signal into at least one given segment having an amplitude level corresponding to the significance of a given bit of the digital code, the given segment for the given bit extending from a base amplitude level to an inflection point corresponding to the amplitude level of the analog input signal at which the next most significant bit of the digital code changes, the given segment repeating over a range of $2^n$ bit transition levels L for the given bit, comprising:
   (a) means for providing a first and a second analog current signal in response to the analog input signal;
   (b) means having one path and another path which is responsive to said second analog current signal for switching said first analog current signal between said one path and said other path, the analog current signal in said one path corresponding to the given segment; and
   (c) means responsive to said first analog current signal when said first analog current signal is switched into said one path for producing the given bit of the digital code.

2. A folding-type A/D converter, according to claim 1, wherein the analog current signal is switched to the other path upon reaching the inflection point.

3. A folding-type A/D converter, according to claim 1, wherein said means for switching comprises a differential pair of transistors, one of said transistors directing the analog current signal via said one path and the other of said transistors directing the analog current signal via said other path.

4. A folding-type A/D converter, according to claim 1, wherein said means for producing comprises means for directly converting the analog current signal in said one path to the given bit of the digital code.

5. A folding-type A/D converter, according to claim 4, wherein said means for directly converting comprises:
   (a) means for changing the analog current signal in said one path to a voltage signal; and
   (b) means, having a threshold voltage, for comparing the threshold voltage with the voltage signal.

6. A folding-type A/D converter, according to claim 5, wherein said means for comparing outputs a logic 1 or logic 0 for the given bit depending on whether the voltage signal exceeds the threshold voltage.

7. A folding-type A/D converter, according to claim 1, wherein a given repeating segment has a plurality of parts, each part being a mirror image of a preceding part.

8. A folding-type A/D converter, according to claim 1, wherein a given repeating segment has a plurality of parts, each part being the same as a preceding part.

9. A folding-type A/D converter for converting an analog voltage input signal to an n-bit digital Gray code, the A/D converter having a transfer function dividing the analog voltage input signal into at least n−1 segments, each of the n−1 segments having an amplitude level corresponding to the significance of a given bit of the Gray code, each n−1 segment extending from a base amplitude level to an inflection point corresponding to the amplitude level of the analog voltage input signal at which the next most significant bit of the Gray code changes, each n−1 segment having at least one first part and at least one second part being a mirror image of a preceding first part, the segment repeating over a range of $2^n$ bit transition levels L for a given bit of given significance, the folding-type A/D converter comprising for the n−1 least significant bits of the Gray code:
   (a) first means for converting the analog voltage input signal to a first analog current signal;
   (b) first means for generating the first parts of the segment of the given bit of given significance, including a plurality of first circuit stage means, each having one path, another path and an output coupled to said one path, for switching the first analog current signal between said one path and said other path, said plurality of first circuit stage means corresponding, respectively, to the first parts;
   (c) second means for converting the analog voltage input signal to a second analog current signal;
   (d) second means for generating the second parts of the segment of the given bit of given significance, including a plurality of second circuit stage means, each having one path, another path and an output coupled to said one path, for switching the second analog current signal between said one path and said other path, said plurality of second circuit stage means corresponding, respectively, to the second parts; and
   (e) means, coupled to said output of each said plurality of first circuit stage means and said output of said plurality of second circuit stage means, for producing the given bit of given significance in dependence on the first analog current signal and the second analog current signal.

10. A folding-type A/D converter, according to claim 9, wherein each of said plurality of first circuit stage means for switching switches the first analog current signal via said one current path until the corresponding inflection point is reached and then switches the first analog current signal via said other path upon reaching the inflection point.

11. A folding-type A/D converter, according to claim 10, wherein each of said plurality of first circuit stage means for switching comprises a differential pair of transistors, one of said transistors coupling the first analog current signal via said one current path and the other of said transistors coupling the first analog current signal via said other current path.

12. A folding-type A/D converter, according to claim 9, wherein said plurality of first circuit stage means for switching comprises:
   (a) controllable means for coupling said one path to said output;

(b) means for directing the first analog current signal via said one path until the corresponding inflection point is reached; and (c) means for controlling said controllable means to decouple said one path from said output until the first analog current signal is above a certain level.

13. A folding-type A/D converter, according to claim 12, wherein said means for controlling comprises current source means being coupled to said one path to provide current in opposition to the first analog current signal.

14. A folding-type A/D converter, according to claim 12, wherein said controllable means for coupling comprises a diode.

15. A folding-type A/D converter, according to claim 12, wherein said means for directing comprises:

(a) a transistor; and (b) current source means producing a current corresponding to the amplitude of the inflection point to turn on said transistor.

16. A folding-type A/D converter, according to claim 9, wherein each of said plurality of second circuit stage means for switching switches the second analog current signal via said other path until the second analog current signal is at the corresponding inflection point, then switches the second analog current signal via said one path, and then when the second analog current signal reaches a certain level decouples said one path from said output.

17. A folding-type A/D converter, according to claim 16, wherein each of said plurality of second circuit stage means for switching comprises a differential pair of transistors, one of said transistors coupling the second analog current signal to said one path and the other of said transistors coupling the second analog current signal to said other path.

18. A folding-type A/D converter, according to claim 9, wherein said means for producing the given bit of given significance comprises:

(a) means for summing current signals in each said output of said plurality of first circuit stage means and said plurality of second circuit stage means to provide a summed signal;

(b) means for converting the summed signal to a summed voltage signal; and (c) means, having a threshold voltage, for comparing the summed voltage signal with the threshold voltage.

19. A folding-type A/D converter, according to claim 9, wherein the first analog current signal is proportional to the input voltage signal.

20. A folding-type A/D converter, according to claim 9, wherein the converter has a full scale voltage range and the second analog current signal is proportional to the difference between the input voltage signal and the full scale voltage signal.

21. A folding-type A/D converter for converting an analog voltage input signal to an n-bit digital Gray code, the A/D converter having a transfer function for dividing the analog voltage input signal at least into n−1 segments, each of the n−1 segments having an amplitude level corresponding to the significance of a given bit of the Gray code, each n−1 segment extending from a base amplitude level to an inflection point being the amplitude level at which the next most significant of the Gray code changes, each n−1 segment having at least one first part and at least one second part repeating as a mirror image of a preceding first part, the folding-type A/D converter having a full-scale voltage range and, for the n−1 least significant bits, comprising:

(a) first means for converting the analog voltage input signal to a first analog current signal proportional to the analog voltage input signal;

(b) first current mirror means, responsive to the first analog current signal, for generating a plurality of first analog tail current signals;

(c) first means for generating the first parts of the segment of the given bit of given significance, including a plurality of first circuit stage means, responsive to the plurality of first analog tail current signals, respectively, and having one path and another path, for switching the respective first analog tail current signals between said one path and said other path, said plurality of first circuit stage means each including a differential pair of transistors, the first analog tail current signals being switched to said one path until a corresponding inflection point is reached and then being switched to said other path;

(d) second means for converting the analog voltage input signal to a second analog current signal proportional to the difference between the analog voltage input signal and the full-scale voltage;

(e) second current mirror means, responsive to the second analog current signal, for generating a plurality of second analog tail current signals;

(f) second means for generating the second parts of the segment of the given bit of given significance, including a plurality of second circuit stage means, responsive to the plurality of second analog tail current signals, respectively, and having one path and another path, for switching the respective second analog tail current signals between said one path and said other path, said plurality of second circuit stage means each including a differential pair of transistors, the second analog tail current signals being switched to said other path until the second analog current signals are at the corresponding inflection point, and then being switched to said one path upon reaching the corresponding inflection point, and then being decoupled from said one path when reaching a certain level;

(g) means for producing a summed analog voltage signal in dependence on the first analog tail current signals and the second analog tail current signals; and (h) means, having a threshold voltage, for comparing the summed analog voltage signal with the threshold voltage.

* * * * *